(12) United States Patent
Liao et al.

(10) Patent No.: US 11,031,543 B2
(45) Date of Patent: Jun. 8, 2021

(54) VIA LANDING ENHANCEMENT FOR MEMORY DEVICE

(71) Applicant: Taiwan Semiconductor Manufacturing Co., Ltd., Hsin-Chu (TW)

(72) Inventors: Chun-Heng Liao, Xindian (TW); Harry-Hak-Lay Chuang, Zhubei (TW); Chang-Jen Hsieh, Hsinchu (TW); Hung Cho Wang, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/412,742

(22) Filed: May 15, 2019

(65) Prior Publication Data

US 2020/0127189 A1    Apr. 23, 2020

Related U.S. Application Data

(60) Provisional application No. 62/749,314, filed on Oct. 23, 2018.

(51) Int. Cl.
| | |
|---|---|
| *H01L 43/02* | (2006.01) |
| *H01L 27/22* | (2006.01) |
| *H01L 45/00* | (2006.01) |
| *H01L 43/12* | (2006.01) |
| *H01L 27/24* | (2006.01) |

(52) U.S. Cl.
CPC .......... *H01L 43/02* (2013.01); *H01L 27/228* (2013.01); *H01L 27/2436* (2013.01); *H01L 43/12* (2013.01); *H01L 45/1233* (2013.01); *H01L 45/1675* (2013.01)

(58) Field of Classification Search
CPC ... H01L 43/02; H01L 27/228; H01L 27/2436; H01L 43/12; H01L 45/1233; H01L 45/1675
USPC .............................................. 257/2
See application file for complete search history.

(56) References Cited

U.S. PATENT DOCUMENTS

| | | |
|---|---|---|
| 8,872,149 B1 | 10/2014 | Hsieh et al. |
| 2005/0263801 A1 | 12/2005 | Park et al. |
| 2006/0054950 A1* | 3/2006 | Baek ............. H01L 45/146 257/295 |
| 2007/0115794 A1 | 5/2007 | Lung |

(Continued)

FOREIGN PATENT DOCUMENTS

KR    20040057569 A    7/2004

*Primary Examiner* — Dzung Tran
(74) *Attorney, Agent, or Firm* — Eschweiler & Potashnik, LLC (57) ABSTRACT

A memory cell with dual sidewall spacers and its manufacturing methods are provided. In some embodiments, a multi-layer stack is formed and patterned to form a hard mask, a top electrode and a resistance switching dielectric. Then, a first dielectric spacer layer is formed over the bottom electrode layer, extending alongside the resistance switching dielectric, the top electrode, and the hard mask, and further extending over the hard mask. Then, a second dielectric spacer layer is formed directly on and conformally lining the first dielectric spacer layer. The first dielectric spacer layer is deposited at a first temperature and the second dielectric spacer layer is deposited at a second temperature higher than that of the first temperature.

20 Claims, 9 Drawing Sheets

(56) References Cited

U.S. PATENT DOCUMENTS

| | | | |
|---|---|---|---|
| 2008/0191186 A1 | 8/2008 | Lung et al. | |
| 2008/0242009 A1 | 10/2008 | Cho | |
| 2014/0131654 A1* | 5/2014 | Tu | H01L 45/1253 |
| | | | 257/4 |
| 2014/0138347 A1 | 5/2014 | Toyosato et al. | |
| 2015/0129827 A1 | 5/2015 | Chen et al. | |
| 2016/0049584 A1* | 2/2016 | Dang | H01L 45/147 |
| | | | 257/4 |
| 2016/0218283 A1* | 7/2016 | Trinh | H01L 45/1675 |
| 2016/0365512 A1* | 12/2016 | Sung | H01L 45/147 |
| 2016/0380183 A1 | 12/2016 | Chuang et al. | |
| 2019/0067559 A1* | 2/2019 | Chang | H01L 43/12 |
| 2019/0074440 A1 | 3/2019 | Yang et al. | |

* cited by examiner

VIA LANDING ENHANCEMENT FOR MEMORY DEVICE

REFERENCE TO RELATED APPLICATION

This application claims the benefit of U.S. Provisional Application No. 62/749,314, filed on Oct. 23, 2018, the contents of which are hereby incorporated by reference in their entirety.

BACKGROUND

Many modern day electronic devices contain electronic memory. Electronic memory may be volatile memory or non-volatile memory. Non-volatile memory is able to store data in the absence of power, whereas volatile memory is not. Non-volatile memory such as magnetoresistive random-access memory (MRAM) and resistive random access memory (RRAM) are promising candidates for next generation non-volatile memory technology due to relative simple structures and their compatibility with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "First", "second", "third", etc. are not intended to be descriptive of the corresponding element. Therefore, "a first dielectric layer" described in connection with a first figure may not necessarily corresponding to a "first dielectric layer" described in connection with another figure.

Figure 1A:
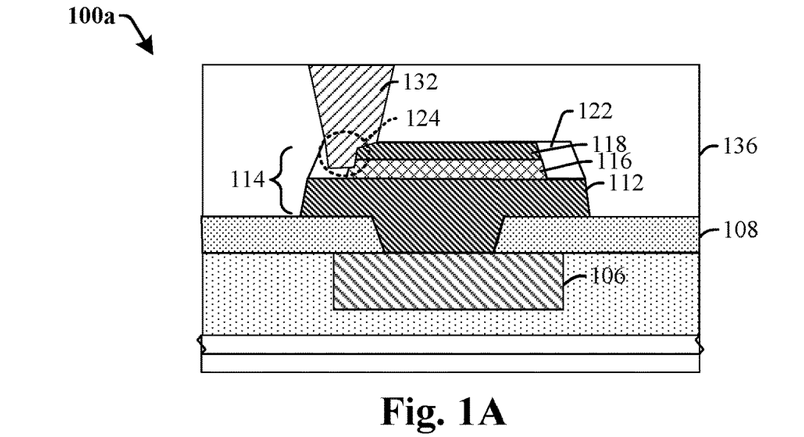
FIG. 1A illustrates a cross-sectional view of some embodiments of a memory cell with a single sidewall spacer.

Referring to a cross-sectional view 100a of FIG. 1A, a memory cell 114 includes a top electrode 118 and a bottom electrode 112 separated by a resistance switching dielectric 116. Depending on a voltage applied to the pair of electrodes, the resistance switching dielectric 116 will undergo a reversible change between a high resistance state associated with a first data state (e.g., a '0' or 'RESET') and a low resistance state associated with a second data state (e.g., a '1' or 'SET'). The memory cell 114 is compatible with complementary metal-oxide-semiconductor (CMOS) logic fabrication processes for data storage and transmission. A first sidewall spacer 122 may be disposed alongside the top electrode 118 and the resistance switching dielectric 116, providing protections to sidewall surfaces of the top electrode 118 and the resistance switching dielectric 116. A dielectric layer 136 is formed overlying and surrounding the top electrode 118, the resistance switching dielectric 116, and the bottom electrode 112. A top electrode via 132 is disposed through the dielectric layer 136 and overlying and contacting the top electrode 118 of the memory cell 114. The process to form the top electrode via 132 introduces contact challenges: the resistance switching dielectric 116 may be damaged when landing the top electrode via 132 on the top electrode 118. In more detail, the top electrode via 132 is formed by a patterning process to form an opening through the dielectric layer 136 to expose the top electrode 118 for the top electrode via 132's filling and landing. The opening may be shifted to an edge of the top electrode 118. As the technology develops and the devices shrink, the formation of the opening may expose and damage the sidewall of the resistance switching dielectric 116, as shown by a dotted line circle 124. As a result, the top electrode 118 and the resistance switching dielectric 116 may be shorted by the top electrode via 132.

In some advanced embodiments, the present application is related to an improved memory device having a via landing enhancement structure including a dual sidewall spacer structure, and corresponding manufacturing methods. The dual sidewall spacer structure may include stacked sidewall spacers comprising different materials or the same material with different densities. An inner sidewall spacer may be formed in-situ such that the memory device is protected before exposing to some ambient interferes. An outer sidewall spacer is then formed ex-situ along the inner sidewall spacer. The outer sidewall spacer may be more resistant to a subsequent via landing etching process, such that sidewalls of the memory device is protected during the via landing etching process.

Figure 1B:
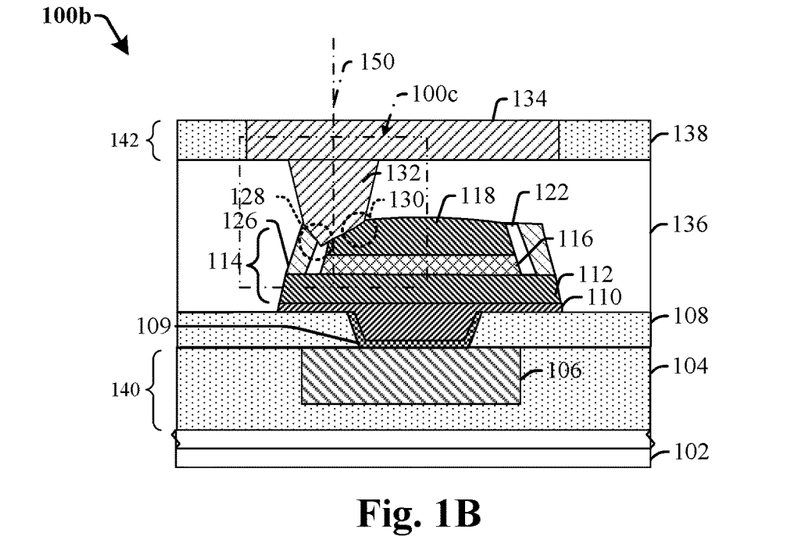
FIG. 1B illustrates a cross-sectional view of some embodiments of a memory cell with dual sidewall spacers.

In some embodiments, referring to a cross-sectional view 100b of FIG. 1B, a memory cell 114 comprises a bottom electrode 112 disposed over a substrate 102. A resistance switching dielectric 116 is disposed over the bottom electrode 112 and having a variable resistance. A top electrode 118 is disposed over the resistance switching dielectric 116. A first sidewall spacer 122 is disposed on an upper surface of the bottom electrode 112 and extended upwardly along sidewalls of the resistance switching dielectric 116 and the top electrode 118. A second sidewall spacer 126 is disposed directly and conformally lining the first sidewall spacer 122. The second sidewall spacer 126 and the first sidewall spacer 122 comprise different materials or the same material with different densities. In some embodiments, the first sidewall spacer 122 is formed in-situ (meaning formed in the same cluster tool without exposing the workpiece in an ambient environment), such that the workpiece is well protected from the ambient environment. The second sidewall spacer 126 is formed ex-situ after transferring the substrate to a different chamber. The second sidewall spacer 126 has a higher etch selectivity and is more resist to an etchant. Thereby, when forming the opening for top electrode via filling by such etchant, the second sidewall spacer 126 can be better retained and provide the resistance switching dielectric 116 from damage. Thus, process window for sidewall protection is less concerned, and short fail of the memory cell 114 is improved.

According to some embodiments, the memory cell 114 shown in FIG. 1B may be inserted within a back-end-of-line (BEOL) metallization stack having a lower interconnect structure 140 and an upper interconnect structure 142 arranged over a substrate 102. The lower interconnect structure 140 includes a bottom metallization line 106 disposed within a bottom interlayer dielectric layer 104. The upper interconnect structure 142 includes a top metallization line 134 disposed within a top interlayer dielectric layer 138. The bottom interlayer dielectric layer 104 and the top interlayer dielectric layer 138 may be, for example, an oxide, a low-k dielectric (i.e., a dielectric with a dielectric constant k less than silicon dioxide) or an extreme low-k dielectric (a dielectric with a dielectric constant k less than about 2), and the bottom metallization lines 106 and the top metallization lines 134 may be, for example, a metal, such as copper.

The bottom electrode 112 of the memory cell 114 may be a conductive material, such as titanium nitride, tantalum nitride, or the combination thereof. An example thickness of the bottom electrode 112 can be in a range of from about 100 Å to about 200 Å. This example thickness, along with other example dimensions given hereafter, may for a certain fabrication node, and proportional scaling of these dimensions for other nodes is amenable. The bottom electrode 112 may also comprise, for example, titanium, tantalum, platinum, iridium, tungsten, ruthenium, or the like. In some embodiments, the bottom electrode 112 is electrically coupled to the bottom metallization line 106 of the lower interconnect structure 140 through a bottom electrode via 110 arranged between the bottom electrode 112 and the bottom metallization lines 106. The bottom electrode via 110 may comprise titanium nitride. An example thickness of the bottom electrode via 110 can be in a range of from about 400 Å to about 500 Å. A barrier liner 109 may be disposed under the bottom electrode via 110 and functions as a diffusion barrier layer to prevent material from diffusing between the bottom metallization lines 106 and the bottom electrode 112.

The barrier liner 109 may comprise tantalum nitride, for example. An example thickness of the barrier liner 109 can be in a range of from about 50 Å to about 100 Å. The bottom electrode via 110 may have a narrower lower portion and a wider upper portion. The upper portion may have a sidewall aligned with that of the bottom electrode 112.

The memory cell 114 further comprises a resistance switching dielectric 116 arranged over the bottom electrode 112. In some embodiments, the memory cell 114 is a magnetoresistive random access memory (MRAM) cell and the resistance switching dielectric 116 can comprise a magnetic tunnel junction (MTJ) structure having a bottom ferromagnetic layer and a top ferromagnetic layer separated by a tunnel barrier layer. In some other embodiments, the memory cell 114 is a resistive random access memory (RRAM) cell and the resistance switching dielectric 116 can comprise a RRAM dielectric layer. The resistance switching dielectric 116 may be a high-k layer (i.e., a layer with a dielectric constant k greater than 3.9), for example, tantalum oxide, tantalum hafnium oxide, tantalum aluminum oxide, or another material that includes tantalum, oxygen, and one or more other elements. The resistance switching dielectric 116 may also include other composite layers. For example, the resistance switching dielectric 116 may include a seed layer disposed at bottom and a barrier layer disposed on top. An example thickness of the resistance switching dielectric 116 can be in a range of from about 300 Å to about 500 Å.

A top electrode 118 is arranged over the resistance switching dielectric 116. The barrier liner 109 may comprise tungsten, for example. An example thickness of the top electrode 118 can be in a range of from about 300 Å to about 400 Å. The top electrode 118 may also comprise one or more metal or metal composition layers comprising, for example, titanium, titanium nitride, tantalum, tantalum nitride, or the like. In some embodiments, the top electrode 118 is electrically coupled to the top metallization line 134 of the upper interconnect structure 142 through a top electrode via 132 arranged between the top electrode 118 and the top metallization line 134. The top electrode via 132 may be, for example, a conductive material, such as such as copper, aluminum, or tungsten. During operation of the memory cell 114, voltages are applied between the top electrode 118 and bottom electrode 112 to read, set, or erase the memory cell 114 by forming or breaking one or more conductive filaments of the resistance switching dielectric 116. Thus the memory cell 114 can have a variable resistance in a comparatively low or high resistance state to stand for low or high bit status, for example.

In some embodiments, the first sidewall spacer 122 is disposed directly on an upper surface of the bottom electrode 112. The first sidewall spacer 122 may directly contact sidewalls of the resistance switching dielectric 116 and the top electrode 118 along sidewalls of the resistance switching dielectric 116 and the top electrode 118. The second sidewall spacer 126 may also disposed directly on the upper surface of the bottom electrode 112 at sides of the first sidewall spacer 122. A sidewall of the second sidewall spacer 126 may be aligned with a sidewall of the bottom electrode 112 and/or the upper portion of the bottom electrode via 110. The first sidewall spacer 122 and the second sidewall spacer 126 may be conformal layers. The second sidewall spacer 126 has a second thickness greater than a first thickness of the first sidewall spacer 122, preferably at least two times of the first thickness. An example thickness of the first sidewall spacer 122 can be in a range of from about 50 Å to about 100 Å. An example thickness of the second sidewall spacer 126 can be in a range of from about 200 Å to about 250 Å. A top surface of the second sidewall spacer 126 may be higher than that of the first sidewall spacer 122. The first sidewall spacer 122 and the second sidewall spacer 126 may be made of different materials or the same material of different densities. The first sidewall spacer 122 and the second sidewall spacer 126 may be made of silicon nitride with different density. The first sidewall spacer 122 and the second sidewall spacer 126 may also comprise one or more dielectric composition layers comprising, for example, silicon oxide, silicon carbide, or the like. The top electrode via 132 may land offset a center region of the top electrode 118 and directly contacts the first sidewall spacer 122 and the second sidewall spacer 126. The first sidewall spacer 122 and the second sidewall spacer 126 may respectively have smaller heights at one side of the memory cell 114 where the top electrode via 132 lands on than an opposite side where the top electrode via 132 is away. The top electrode via 132 may have a bottom landing on the first sidewall spacer 122 or the second sidewall spacer 126. The top electrode via 132 may have an asymmetrical shape along an extending vertical line 150 that bisects a top of the top electrode via 132: a lower sidewall at one side closer to a boundary of the memory cell 114 is more inside tilted (more leaning to the extending vertical line 150) than the other side closer to a center region of the memory cell 114, as shown by dotted circles 128, 130. More detailed structures of the top electrode via 132, the first sidewall spacer 122, and the second sidewall spacer 126 are discussed below with respect to FIG. 1C. The first sidewall spacer 122 and the second sidewall spacer 126 protect the top electrode 118 and the resistance switching dielectric 116 from shortage and is used during the manufacture of the memory cell 114 to define a foot print of the bottom electrode 112.

In some embodiments, a lower dielectric layer 108 is disposed surrounding the bottom electrode via 110. The lower dielectric layer 108 may comprise silicon carbide, silicon nitride, silicon oxide, or one or more layers of composite dielectric films, for example. A dielectric layer 136 is disposed over the lower dielectric layer 108. The dielectric layer 136 may comprise silicon oxide. The dielectric layer 136 may have a bottom surface directly contacts a top surface of the lower dielectric layer 108. The dielectric layer 136 may have a top surface directly contacts a bottom surface of the top interlayer dielectric layer 138. The second sidewall spacer 126 may directly contact the dielectric layer 136.

Figure 1C:
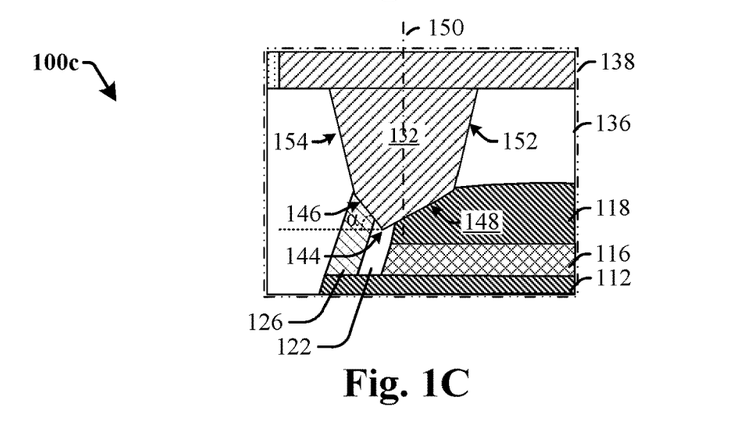
FIG. 1C illustrates a partial cross-sectional view of some embodiments of the memory cell shown in FIG. 1B.

FIG. 1C illustrates a cross-sectional view 100c of an enlarged region of the memory cell shown in FIG. 1B according to some embodiments. As shown in FIG. 1C, the top electrode via 132 may has a lowest tip 144 offset from the extending vertical line 150. The lowest tip 144 may sit on an concave upper surface of the first sidewall spacer 122. The top electrode via 132 may also have a first lower sidewall 146 contacting the second sidewall spacer 126 at one side closer to a boundary of the memory cell and a second lower sidewall 148 contacting the top electrode 118 at an opposite side closer to a center region of the memory cell. The first lower sidewall 146 and the second lower sidewall 148 may have different tilt angles. The first lower sidewall 146 may have an tilt angle relative to a lateral level greater than that of the second lower sidewall 148. In some embodiments, the first lower sidewall 146 may have an tilt angle α in a range of from about 20 degree to about 30 degree. The tilt angle α is relative large compared to the structures with single sidewall spacer, where a tilt angle may be smaller than 10 degree. As will be discussed again below, the more titled lower sidewall may be a result of etching selectivity of the via opening etching process: the etchant may have a higher selectivity to the second sidewall spacer 126 than to the first sidewall spacer 122. A first upper sidewall 154 closer to the boundary of the memory cell and a second upper sidewall 152 closer to the center of the memory cell may have a substantially same tilt angle.

Figure 2:
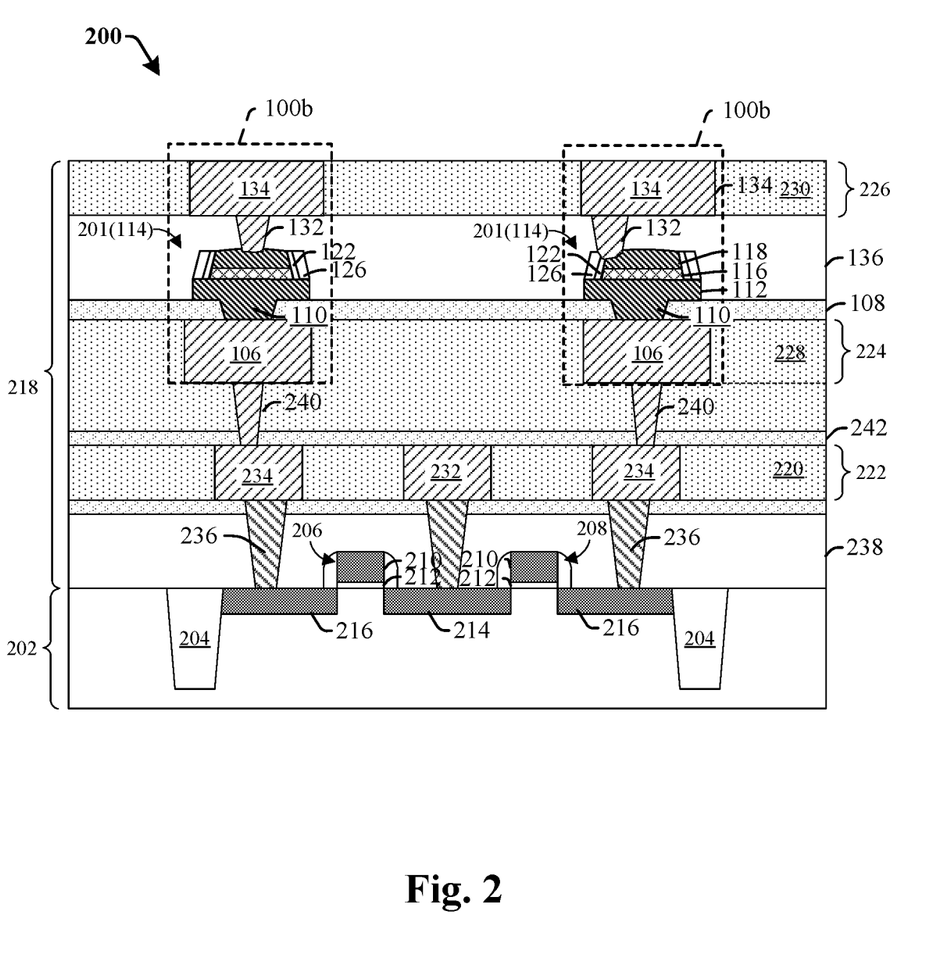
FIG. 2 illustrates a cross-sectional view of some embodiments of an integrated circuit with the memory cell of FIG. 1B.

FIG. 2 illustrates a cross-sectional view of an integrated circuit device 200 including a memory cell 201 according to some additional embodiments. The memory cell 201 may have the same structure as the memory cell 114 shown in FIG. 1B and described above. As shown in FIG. 2, the memory cell 201 can be disposed over a substrate 202. The substrate 202 may be, for example, a bulk substrate (e.g., a bulk silicon substrate) or a silicon-on-insulator (SOI) substrate. One or more shallow trench isolation (STI) regions 204 or oxide-filled trenches are disposed in the substrate 202. A pair of word line transistors 206, 208 is spaced between the STI regions 204. The word line transistors 206, 208 extend parallel to each other, and include word line gates 210 separated from the substrate 202 by word line dielectric layers 212, and source/drain regions 214, 216. The source/drain regions 214, 216 are embedded within the surface of the substrate 202 between the word line gates 210 and the STI regions 204. The word line gates 210 may be, for example, doped polysilicon or a metal, such as titanium nitride or tantalum nitride. The word line dielectric layers 212 may be, for example, an oxide, such as silicon dioxide. A bottom-most ILD layer 238 is disposed overlying the word line transistors 206, 208. The bottom-most ILD layer 238 may be an oxide.

A back-end-of-line (BEOL) metallization stack 218 is arranged over the word line transistors 206, 208. The BEOL metallization stack 218 includes a plurality of metallization layers 222, 224, 226 respectively arranged within the interlayer dielectric layers 220, 228, 230. The metallization layers 222, 224, 226 may be, for example, a metal, such as copper or aluminum. The interlayer dielectric layers 220, 228, 230 may be, for example, a low K dielectric, such as porous undoped silicate glass, or an oxide, such as silicon dioxide. Etch stop layers 108, 242 may be disposed to separate the interlayer dielectric layers 220, 228, 230. The metallization layers 222, 224, 226 include a source line 232 coupled to a source/drain region 214 shared by the word line transistors 206, 208. Further, the metallization layers 222, 224, 226 include a bit line 134 connected to the memory cell 201 and further connected to a source/drain region 216 of the word line transistor 206 or the word line transistor 208 through a plurality of metallization lines, such as metallization lines 106, 234, and a plurality of vias, such as vias 132, 110, 240. A contact 236 extends from the metallization line 234 through the bottom-most ILD layer 238 to reach the source/drain region 216. The vias 132, 110, 240 and the contact 236 may be, for example, a metal, such as copper, gold, or tungsten.

The memory cell 201 is inserted between a top metallization line 134 and a bottom metallization line 106. A dielectric layer 136 is disposed overlying the memory cell 201 between the interlayer dielectric layers 228, 230. The dielectric layer 136 may be an oxide. Though the memory cell 201 is shown as inserted between the upper metallization layer 226 and the lower metallization layer 224 in FIG. 2, it is appreciated that the memory cell 201 can be inserted between any two of the metallization layers of the BEOL metallization stack 218.

Similar as described above associated with FIG. 1B, the memory cell 201 comprises a bottom electrode 112 connecting or seamless contacting a bottom electrode via 110.

A resistance switching dielectric 116 is disposed over the bottom electrode 112. A top electrode 118 is disposed over the resistance switching dielectric 116. A first sidewall spacer 122 is disposed on an upper surface of the bottom electrode 112 and extends upwardly along sidewalls of the resistance switching dielectric 116 and the top electrode 118. A second sidewall spacer 126 is disposed on sidewalls of the first sidewall spacer 122. A top electrode via 132 connects the top metallization line 134 and the top electrode 118. As shown by an exemplary memory cell on the left, the top electrode via 132 may have a bottom surface landing on a top surface of the top electrode 118. As shown by another exemplary memory cell on the right, the top electrode via 132 may also offset from the top electrode 118 and land partially on upper surfaces of the first sidewall spacer 122 and the second sidewall spacer 126. The second sidewall spacer 126 and the first sidewall spacer 122 have different etch selectivity. The second sidewall spacer 126 may be made of a different material or a different density than the first sidewall spacer 122. The first sidewall spacer 122 may be formed immediately following the patterning of the resistance switching dielectric 116. The second sidewall spacer 126 is more resist to the etchant of the via opening etch, such that short damage can be prevented when the via opening is formed to expose the top electrode 118 and prepare for top electrode via filling.

FIGS. 3-14 illustrate some embodiments of cross-sectional views showing a method of forming an integrated circuit device.

Figure 3:
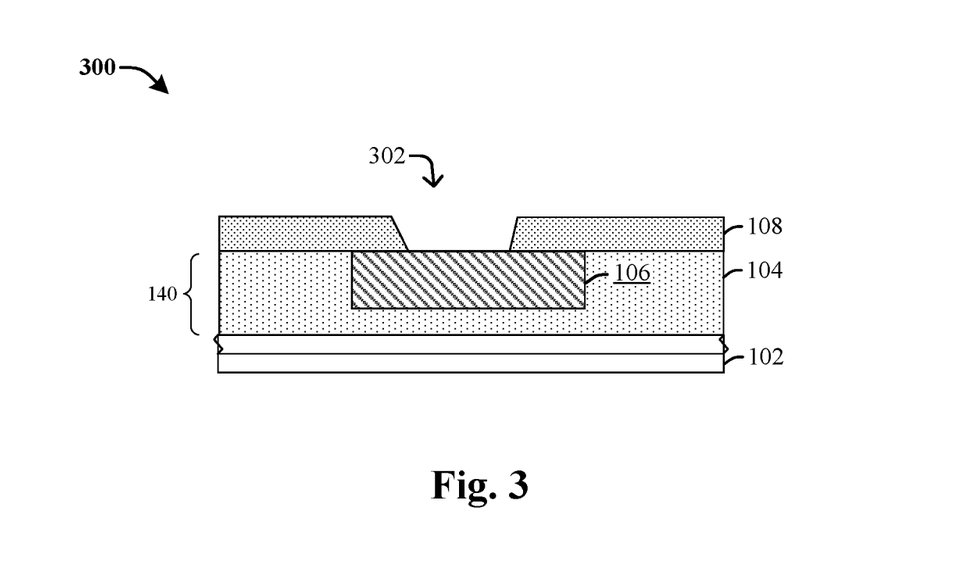
FIGS. 3-14 illustrate a series of cross-sectional views of some embodiments of an integrated circuit at various stages of manufacture, the integrated circuit including a memory cell.

As shown in cross-sectional view 300 of FIG. 3, a bottom via opening 302 is formed within a lower dielectric layer 108 overlying a lower interconnect structure 140. The lower interconnect structure 140 includes a bottom metallization line 106 laterally surrounded by a bottom interlayer dielectric layer 104. The bottom interlayer dielectric layer 104 may be, for example, a low-k dielectric, and the bottom metallization line 106 may be, for example, a metal, such as copper. The lower dielectric layer 108 is formed over the lower interconnect structure 140 with the bottom via opening 302 exposing the bottom metallization line 106. The lower dielectric layer 108 may comprise, for example, one or more layers of dielectrics, such as silicon dioxide, silicon carbide, and/or silicon nitride. The process for forming the bottom via opening 302 may include depositing the lower dielectric layer 108 over the lower interconnect structure 140 followed by a photolithography process. A photoresist layer may be formed over the lower dielectric layer 108 and exposing regions of lower dielectric layer 108 corresponding to the bottom via opening 302 to be formed. Then, one or more etchants selective of the lower dielectric layer 108 may be applied according to the photoresist layer. After applying the one or more etchants, the photoresist layer may be removed.

Figure 4:
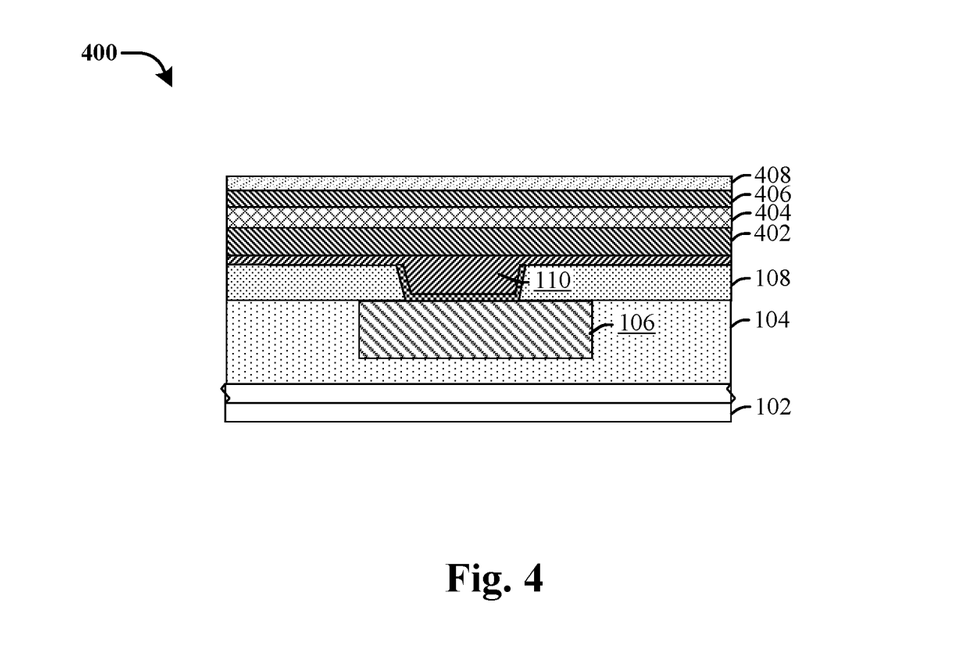

As shown in cross-sectional view 400 of FIG. 4, a multi-layer stack of a memory cell is deposited over the lower dielectric layer 108 by a series of vapor deposition techniques (e.g., physical vapor deposition, chemical vapor deposition, etc.). A bottom electrode via 110 is firstly formed over the lower dielectric layer 108 and filling the bottom via opening 302 (shown in FIG. 3). The bottom electrode via 110 may be, for example, formed of one or more layers conductive materials, such as polysilicon, titanium nitride, tantalum nitride, platinum, gold, iridium, ruthenium, tungsten, or the like. For example, the bottom electrode via 110 may be a titanium nitride layer formed by an atomic layer deposition (ALD) process, followed by a planarization process. Then a bottom electrode layer 402 is formed over the bottom electrode via 110 and the lower dielectric layer 108. The bottom electrode layer 402 may be the same material as the bottom electrode via and may even be formed in one deposition process with the bottom electrode via 110. The bottom electrode layer 402 may be formed having a recess corresponding to the bottom electrode via 110. A planarization process may be subsequently performed to form a planar top surface for the bottom electrode layer 402. In some embodiments, the bottom electrode layer 402 may comprise a metal nitride (e.g., titanium nitride (TiN), tantalum nitride (TaN), or the like) and/or a metal (e.g., titanium (Ti), tantalum (Ta), or the like). Then a resistive switching layer 404 is formed over the planarized bottom electrode layer 402. In some embodiments, the resistive switching layer 404 may comprise a magnetic tunnel junction (MTJ) structure having a pinned magnetic layer and a free magnetic layer, which are vertically separated by a dielectric barrier layer. In other embodiments, the resistive switching layer 404 may comprise a RRAM dielectric data storage layer. In some embodiments, the resistive switching layer 404 may comprise a metal oxide composite such as hafnium aluminum oxide ($HfAlO_x$), zirconium oxide ($ZrO_x$), aluminum oxide ($AlO_x$), nickel oxide ($NiO_x$), tantalum oxide ($TaO_x$), or titanium oxide ($TiO_x$). A top electrode layer 406 is formed over the resistive switching layer 404. The top electrode layer 406 may comprise one or more conductive layers. In some embodiments, the top electrode layer 406 may comprise titanium nitride (TiN) or tantalum nitride (TaN), a metal (e.g., titanium (Ti) or tantalum (Ta) copper) etc. A hard mask layer 408 is formed over the top electrode layer 406. The hard mask layer 408 may comprise dielectric materials such as silicon carbide.

Figure 5:
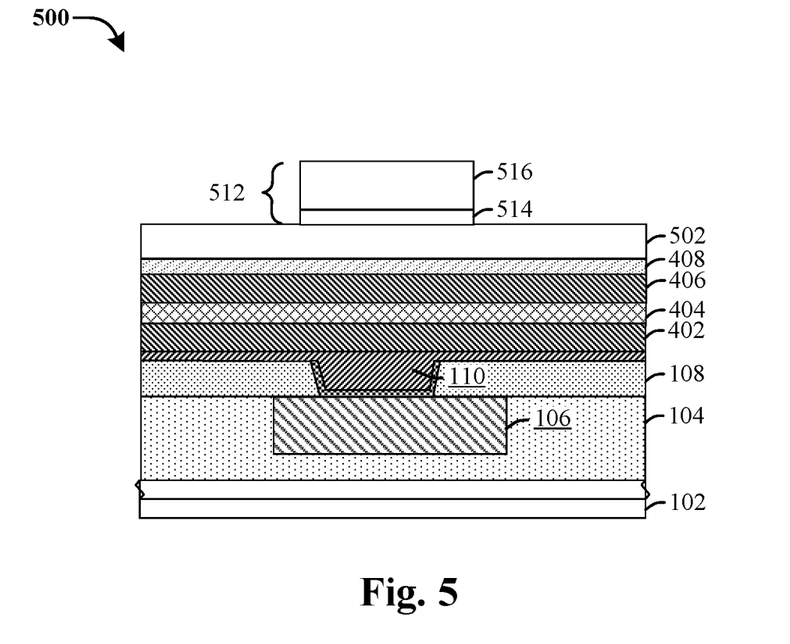

As shown in cross-sectional view 500 of FIG. 5, a multi-layer stack 502 of patterning layers is formed over the hard mask layer 408 for patterning the memory cell. The multi-layer stack 502 may comprise a plurality of hard mask layers such as titanium nitride (TiN), tantalum nitride (TaN), titanium (Ti), tantalum (Ta), copper, advanced pattern film (APF), and/or silicon oxynitride (SiON), etc. A patterning layer 512 is formed over the multi-layer stack 502. The patterning layer 512 may include a bottom antireflective coating (BARC) layer 514 and a photoresist layer 516 which has been spin-coated over the BARC layer 514 and patterned, for example, using a double-patterning technique.

Figure 6:
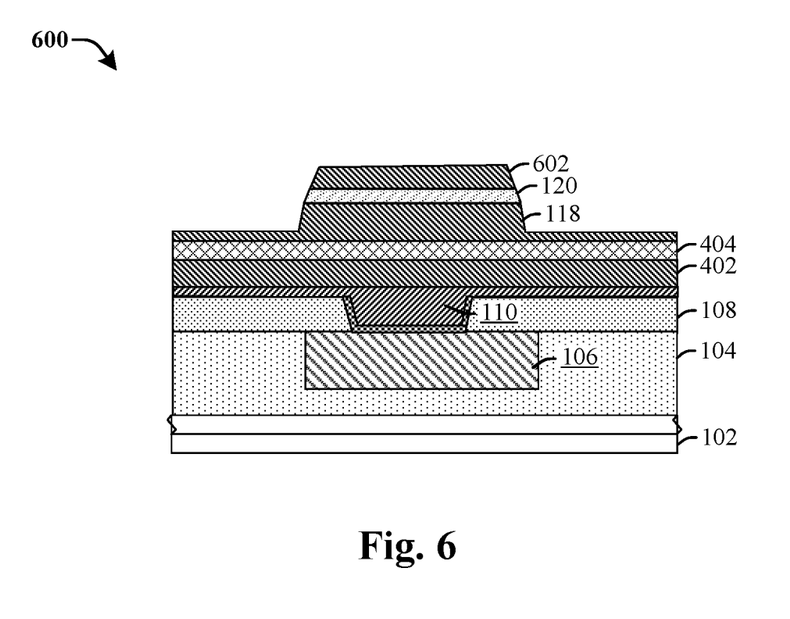

As shown in cross-sectional view 600 of FIG. 6, the top electrode layer 406 (shown in FIG. 5) is patterned to form a top electrode 118. The top electrode 118 is formed according to a hard mask 120, which is formed by patterning the hard mask layer 408 (shown in FIG. 5). The multi-layer stack 502 (shown in FIG. 5) is patterned layer by layer, and a patterning mask 602 is formed over the hard mask 120 as a result. The patterning mask 602 may also comprise more or fewer layers of the multi-layer stack 502 of FIG. 5. In some embodiments, the patterning mask 602, the hard mask 120, and the top electrode 118 may formed to have tilted sidewalls as the result of the patterning process. In some embodiments, the patterning process can comprise a dry etching process that may have an etchant chemistry including $CF_4$, $CH_2F_2$, $Cl_2$, $BCl_3$ and/or other chemicals.

Figure 7:
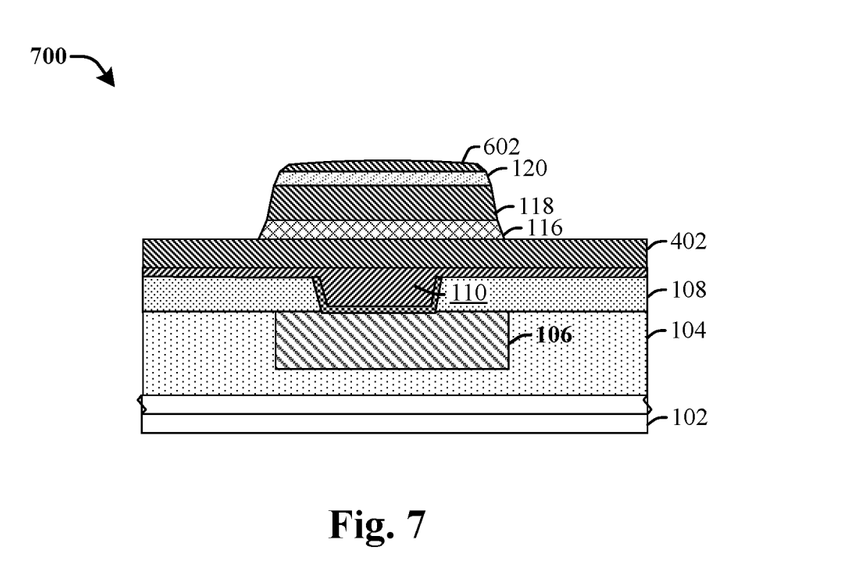

As shown in cross-sectional view 700 of FIG. 7, the resistive switching layer 404 (shown in FIG. 6) is patterned to form a resistance switching dielectric 116 according to the patterning mask 602 and the hard mask 120. During the patterning process, the patterning mask 602 (shown in FIG. 6) may be substantially removed or reduced. The bottom electrode layer 402 may be exposed. In some embodiments, sidewalls of the resistance switching dielectric 116 and the top electrode 118 can be tilted and aligned (e.g., co-planar). In some embodiments, the patterning process can comprise a dry etching process that may have an etchant chemistry including $CF_4$, $CH_2F_2$, $Cl_2$, $BCl_3$ and/or other chemicals.

Figure 8:
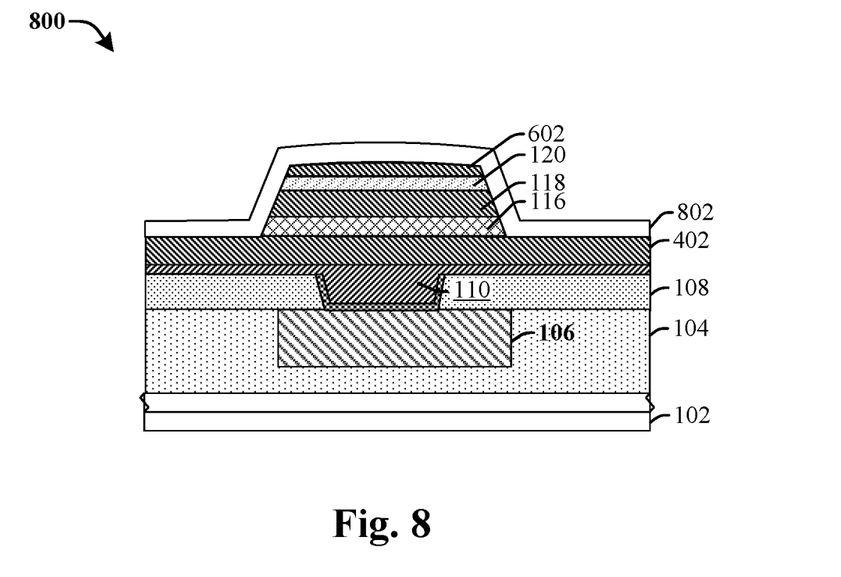

As shown in cross-sectional view 800 of FIG. 8, a first dielectric spacer layer 802 is formed along an upper surface of the planarized bottom electrode layer 402, extending along sidewall surfaces of the resistance switching dielectric 116, the top electrode 118, the hard mask 120, and the patterning mask 602, and covering a top surface of the patterning mask 602. The first dielectric spacer layer 802 may comprise silicon nitride, tetraethyl orthosilicate (TEOS), silicon-rich oxide (SRO), or a similar composite dielectric film. In some embodiments, the first dielectric spacer layer 802 may be formed by a vapor deposition technique (e.g., physical vapor deposition, chemical vapor deposition, etc.). The forming of the first dielectric spacer layer 802 may be performed in the same cluster tool, or in even in the same chamber as the patterning process as described above associated with FIG. 7. The first dielectric spacer layer 802 may be formed at a relative low temperature, for example, around 180 Celsius.

Figure 9:
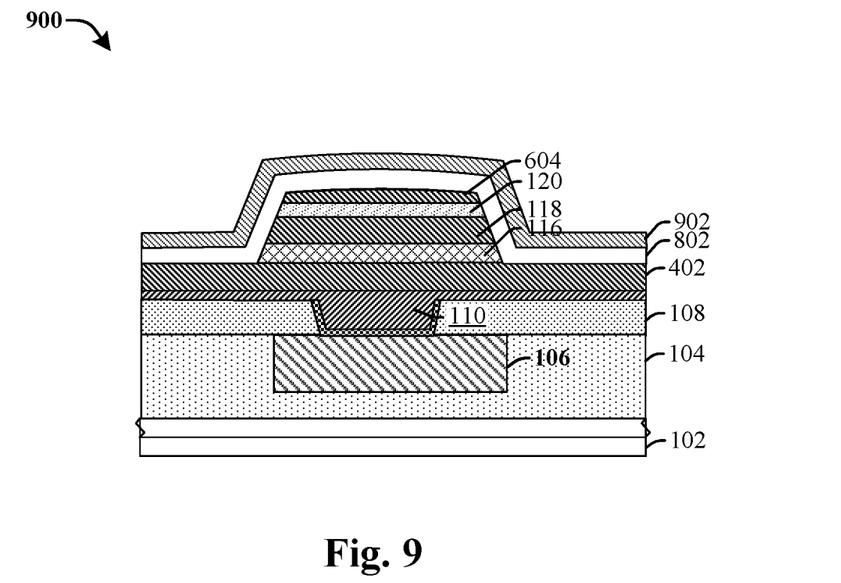

As shown in cross-sectional view 900 of FIG. 9, a second dielectric spacer layer 902 along top surfaces of the first dielectric spacer layer 802. The second dielectric spacer layer 902 may be formed directly on and conformally lining the first dielectric spacer layer 802. The workpiece is removed from the chamber or even the cluster tool where the first dielectric spacer layer 802 is formed and transferred to a new chamber/cluster tool, such that the second dielectric spacer layer 902 can be formed with different material, or the same material with the first dielectric spacer layer 802 but with greater density. In some embodiments, the second dielectric spacer layer 902 is formed at a second temperature higher than that of a first temperature of forming the first dielectric spacer layer 802. The second dielectric spacer layer 902 may also comprise silicon nitride, tetraethyl orthosilicate (TEOS), silicon-rich oxide (SRO), or a similar composite dielectric film. In some embodiments, the second dielectric spacer layer 902 may be formed by a vapor deposition technique (e.g., physical vapor deposition, chemical vapor deposition, etc.). The second dielectric spacer layer 902 may be formed at a relative higher temperature, for example, around 300 Celsius to 400 Celsius. In some embodiments, the second dielectric spacer layer 902 is formed to have a second thickness greater than at least two times of a first thickness of the first dielectric spacer layer 802. The first dielectric spacer layer 802 protects the workpiece is protected from ambient environment immediately after patterning to form the resistance switching dielectric 116. The thicker, and more retained second dielectric spacer layer 902 is formed to prepare for the protection of the memory cell from the top electrode via opening and landing process, as described later on. For example, the second dielectric spacer layer 902 may have a thickness in a range of from about 200 Å to about 250 Å while the first dielectric spacer layer 802 may have a thickness in a range of from about 50 Å to about 100 Å.

Figure 10:
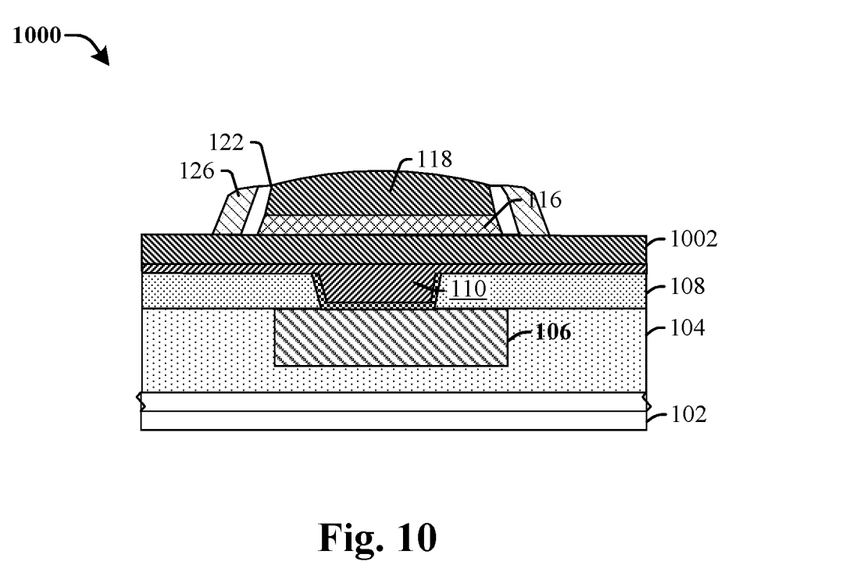

As shown in cross-sectional view 1000 of FIG. 10, the first dielectric spacer layer 802 and the second dielectric spacer layer 902 are etched to respectively form a first sidewall spacer 122 and a second sidewall spacer 126. The process for forming the first sidewall spacer 122 and the second sidewall spacer 126 may include performing an anisotropic etch (e.g. a vertical etch) to the first and second dielectric spacer layers 802, 902 to remove lateral stretches of the dielectric spacer layer 802, 902, thereby resulting in the first sidewall spacer 122 and the second sidewall spacer 126 along the sidewall surfaces of the resistance switching dielectric 116 and the top electrode 118. The bottom electrode layer 402 may be exposed as a result of removing the lateral stretches of the dielectric spacer layer 802, 902. The patterning mask 602 and the hard mask 120 (shown in FIG. 8) may be removed during the etching process.

Figure 11:
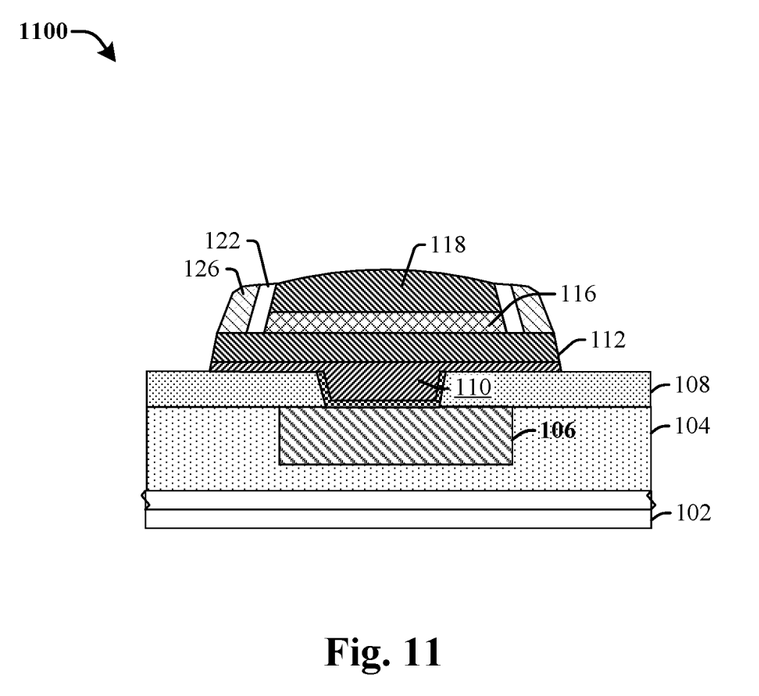

As shown in cross-sectional view 1100 of FIG. 11, an etch is performed to pattern the bottom electrode layer 402 and form a bottom electrode 112 according to the second sidewall spacer 126. The etch can comprise a dry etch such as a plasma etching process that may have an etchant chemistry including $CF_4$, $CH_2F_2$, $Cl_2$, $BCl_3$ and/or other chemicals. In some embodiments, an upper portion of the bottom electrode via 110 may also be etched following the bottom electrode layer 402. As a result of the etching process, the bottom electrode 112 and the upper portion of the bottom electrode via 110 may have sidewalls aligned with that of the second sidewall spacer 126, and a lower dielectric layer 108 may be exposed.

Figure 12:
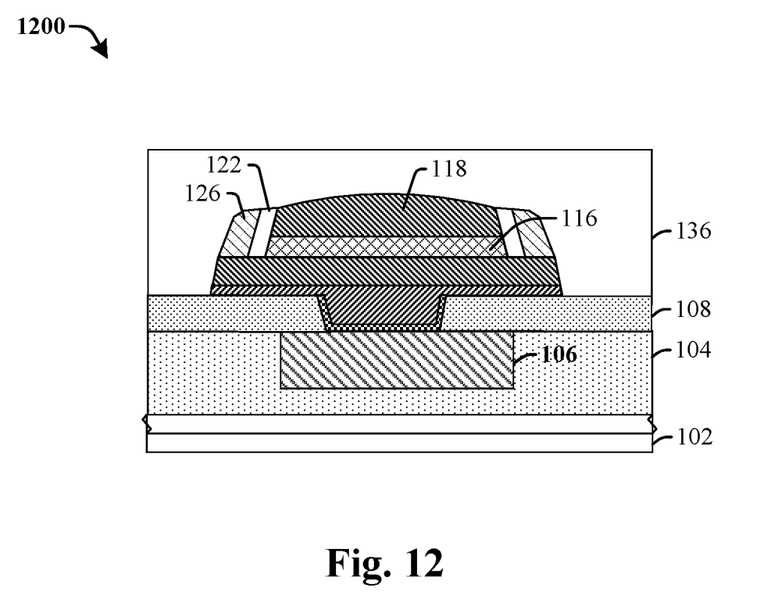

As shown in cross-sectional view 1200 of FIG. 12, a dielectric layer 136 is formed over and surrounding the memory cell. The dielectric layer 136 may be, for example, a low-k or an extreme low-k dielectric. In some embodiments, the process for forming the dielectric layer 136 includes depositing an intermediate interlayer dielectric layer and performing a chemical mechanical polish (CMP) into the intermediate interlayer dielectric layer to planarize the top surface of the intermediate interlayer dielectric layer.

Figure 13:
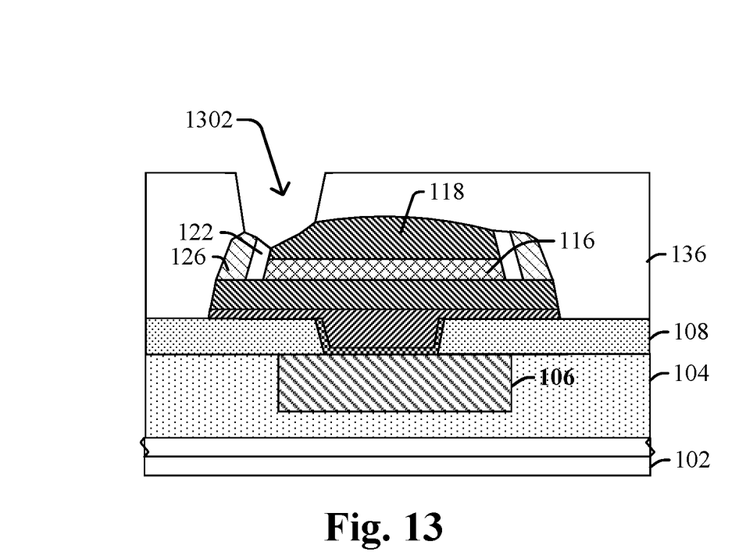

As shown in cross-sectional view 1300 of FIG. 13, a top electrode via opening 1302 is formed through the dielectric layer 136 and reaches on the top electrode 118. The top electrode via opening 1302 is formed by an etching process using an etchant that is selective to the dielectric layer 136 relative to the first sidewall spacer 122 and the second sidewall spacer 126. In a good alignment condition, the top electrode via opening 1302 is formed at a center region of the top electrode 118 and is away from an edge of the top electrode 118, for example, as shown by the memory cell on left side of FIG. 2. In a less ideal alignment condition, the top electrode via opening 1302 may be formed at one side of the memory cell closer to a boundary, for example, as shown by the memory cell in FIG. 13, FIG. 1B or on right side of FIG. 2. Thus, besides exposing the top electrode 118, the top electrode via opening 1302 may also expose the first sidewall spacer 122 and/or the second sidewall spacer 126. Since the second sidewall spacer 126 is made to be more resistant to the etching process of the top electrode via opening 1302, as an etching result, the second sidewall spacer 126 may have a top surface higher than that of the first sidewall spacer 122. The first sidewall spacer 122 and the second sidewall spacer 126 protect a sidewall of the resistance switching dielectric 116 from being reached and exposed. Thereby, the resistance switching dielectric 116 and the top electrode 118 are protected from shorting by a subsequently filled conductive material.

Figure 14:
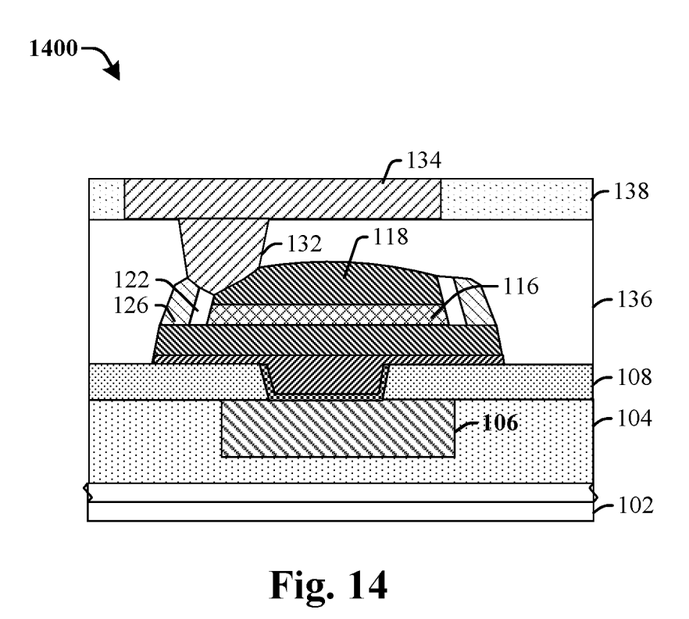

As shown in cross-sectional view 1400 of FIG. 14, a conductive layer is then formed filling the top electrode via opening 1302 to form a top electrode via 132. The conductive layer may be, for example, a metal, such as copper or tungsten. The process for forming the conductive layer may include depositing an intermediate conductive layer filling the top electrode via opening 1302 and overhanging the dielectric layer 136 to form the top electrode via 132 and to form a top metallization line 134. Photolithography may then be used to pattern the conductive layer. In some embodiments, the top electrode via 132 and the top metallization line 134 may be formed by a single damascene process, a trench-first or a via-first dual damascene process, or other applicable metal filling processes. As a result of the filling, the top electrode via 132 may have a bottom surface contacting the first sidewall spacer 122 and a sidewall surface contacting the second sidewall spacer 126. Some examples of detailed top electrode via structures are discussed above with reference to FIG. 1B, FIG. 1C, and FIG. 2.

Figure 15:
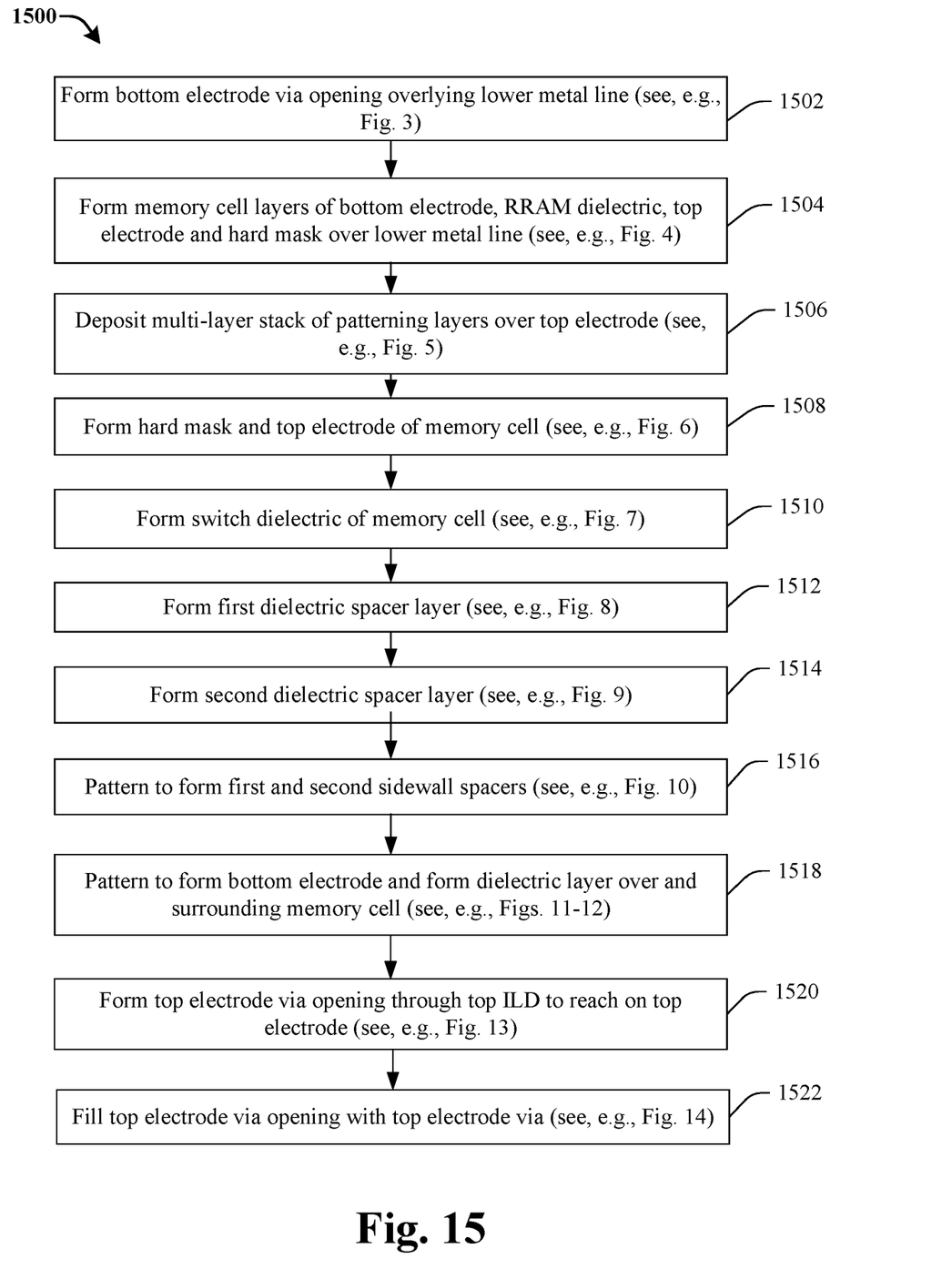
FIG. 15 illustrates a flow diagram of some embodiments of a method for manufacturing an integrated circuit with a memory cell.

FIG. 15 shows some embodiments of a flow diagram of a method 1500 of forming a memory device. Although method 1500 is described in relation to FIGS. 3-14, it will be appreciated that the method 1500 is not limited to such structures disclosed in FIGS. 3-14, but instead may stand alone independent of the structures disclosed in FIGS. 3-14. Similarly, it will be appreciated that the structures disclosed in FIGS. 3-14 are not limited to the method 1500, but instead may stand alone as structures independent of the method 1500. Also, while disclosed methods (e.g., method 1500) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1502, a bottom via opening is formed within a lower dielectric layer overlying a lower interconnect structure. The lower interconnect structure may comprise a bottom metallization line laterally surrounded by a bottom interlayer dielectric layer. The bottom via opening is formed through the lower dielectric layer to expose the bottom metallization line. FIG. 3 illustrates some embodiments of a cross-sectional view 300 corresponding to act 1502.

At act 1504, a multi-layer stack is deposited over the lower dielectric layer by a series of vapor deposition techniques (e.g., physical vapor deposition, chemical vapor deposition, etc.). A bottom electrode via is firstly formed over the lower dielectric layer and filling the bottom via opening. The bottom electrode via may be a titanium nitride layer formed by an atomic layer deposition (ALD) process, followed by a planarization process. Then, a bottom electrode layer, a resistive switching layer, a top electrode layer, and a hard mask layer are subsequently formed over the bottom electrode via and the lower dielectric layer. In some embodiments, the bottom electrode layer may comprise a metal nitride (e.g., titanium nitride (TiN), tantalum nitride (TaN), or the like) and/or a metal (e.g., titanium (Ti), tantalum (Ta), or the like). In some embodiments, the resistive switching layer may comprise a magnetic tunnel junction (MTJ) structure having a pinned magnetic layer and a free magnetic layer, which are vertically separated by a dielectric barrier layer. In other embodiments, the resistive switching layer may comprise a RRAM dielectric data storage layer. In some embodiments, the top electrode layer may comprise titanium nitride (TiN) or tantalum nitride (TaN), a metal (e.g., titanium (Ti) or tantalum (Ta) copper) etc. The hard mask layer may comprise dielectric materials such as silicon carbide. FIG. 4 illustrates some embodiments of a cross-sectional view 400 corresponding to act 1504.

At act 1506, a multi-layer stack of patterning layers is formed over the hard mask layer for patterning the memory cell. The multi-layer stack may comprise a conductive layer and a plurality of hard mask layers formed over the conductive layer. The conductive layer may comprise titanium nitride (TiN) or tantalum nitride (TaN), a metal (e.g., titanium (Ti) or tantalum (Ta) copper) etc. The plurality of hard mask layers may comprise one or more of an advanced pattern film (APF), silicon oxynitride (SiON), etc. A bottom antireflective coating (BARC) layer and a photoresist layer are formed and patterned over the plurality of hard mask layers. FIG. 5 illustrates some embodiments of a cross-sectional view 500 corresponding to act 1506.

At act 1508, the multi-layer stack is patterned layer by layer, and a patterning mask is formed over the hard mask layer as a result. Then a hard mask is formed by patterning the hard mask layer. A top electrode is formed according to the hard mask. In some embodiments, the patterning mask, the hard mask and the top electrode may form to have tilted sidewalls as the result of the patterning process. In some embodiments, the patterning process can comprise a dry etching process that may have an etchant chemistry including $CF_4$, $CH_2F_2$, $Cl_2$, $BCl_3$ and/or other chemicals. FIG. 6 illustrates some embodiments of a cross-sectional view 600 corresponding to act 1508.

At act 1510, the resistive switching layer is patterned to form a resistance switching dielectric according to the top electrode and the hard mask. During the patterning process, the patterning mask may be substantially removed or reduced. The bottom electrode layer may be exposed. In some embodiments, sidewalls of the resistance switching dielectric and the top electrode can be tilted and aligned (e.g., co-planar). In some embodiments, the patterning process can comprise a dry etching process. FIG. 7 illustrates some embodiments of a cross-sectional view 700 corresponding to act 1510.

At act 1512, a first dielectric spacer layer is formed along an upper surface of the bottom electrode layer, extending along sidewall surfaces of the resistance switching dielectric, the top electrode, and the hard mask, and covering a top surface of the hard mask. The first dielectric spacer layer may comprise silicon nitride, tetraethyl orthosilicate (TEOS), silicon-rich oxide (SRO), or a similar composite dielectric film. In some embodiments, the first dielectric spacer layer may be formed in the same chamber or in the same cluster tool as the patterning process described with reference to act 1510. The first dielectric spacer layer may be a conformal layer and may be formed by a vapor deposition technique (e.g., chemical vapor deposition, etc.). FIG. 8 illustrates some embodiments of a cross-sectional view 800 corresponding to act 1512.

At act 1514, a second dielectric spacer layer is formed on and along a top surface of the first dielectric spacer layer. The second dielectric spacer layer may be formed by a different dielectric material, or the same dielectric material with a greater density. The second dielectric spacer layer may comprise silicon nitride, tetraethyl orthosilicate (TEOS), silicon-rich oxide (SRO), or a similar composite dielectric film. In some embodiments, the second dielectric spacer layer may be formed in a different chamber and formed to be more resistant (i.e., with a smaller etching rate of the top via opening etchant described below with reference to act 1520). The second dielectric spacer layer may be a conformal layer and may be formed by a vapor deposition technique (e.g., chemical vapor deposition, etc.). FIG. 9 illustrates some embodiments of a cross-sectional view 800 corresponding to act 1514.

At act 1516, a first sidewall spacer and a second sidewall spacer is respectively formed from the first dielectric spacer layer and a second dielectric spacer layer. The process for forming the first sidewall spacer and the second sidewall spacer may include performing an anisotropic etch (e.g. a vertical etch) to the first and second dielectric spacer layers to remove lateral stretches of the first and second dielectric spacer layers, thereby resulting in the first sidewall spacer and the second sidewall spacer along the sidewall surfaces of the resistance switching dielectric and the top electrode. FIG. 10 illustrates some embodiments of a cross-sectional view 1000 corresponding to act 1516.

At act 1518, an etch is performed to pattern and form a bottom electrode according to the second sidewall spacer and the hard mask. A dielectric layer is then formed over and surrounding the memory cell. The dielectric layer may be, for example, a low-k or an extreme low-k dielectric. In some embodiments, the process for forming the dielectric layer 136 includes depositing an intermediate interlayer dielectric layer and performing a chemical mechanical polish (CMP) into the intermediate interlayer dielectric layer to planarize the top surface of the intermediate interlayer dielectric layer. FIGS. 11-12 illustrates some embodiments of cross-sectional views 1100 and 1200 corresponding to act 1518.

At act 1520, a top electrode via opening is formed through the dielectric layer and reach on the top electrode. The top electrode via opening is formed by an etching process using an etchant that is selective to the dielectric layer relative to the first sidewall spacer and the second sidewall spacer. The top electrode via opening may be formed at one side of the memory cell closer to a boundary. Thus, the top electrode via opening may expose the first sidewall spacer and/or the second sidewall spacer. Since the second sidewall spacer is made to be more resistant to the etching process of the top electrode via opening, the second sidewall spacer may have a top surface higher than that of the first sidewall spacer as an etching result. The first sidewall spacer and the second sidewall spacer protect a sidewall of the resistance switching dielectric from being reached and exposed. Thereby, the resistance switching dielectric and the top electrode are protected from shorting by a subsequently filled conductive material. FIG. 13 illustrates some embodiments of a cross-sectional view 1300 corresponding to act 1520.

At act 1522, a conductive layer is formed filling the top electrode via opening to form a top electrode via, and overhanging the dielectric layer to form a top metallization line. The conductive layer may be, for example, a metal, such as copper or tungsten. The process for forming the conductive layer may include depositing an intermediate conductive layer over the remaining dielectric layer and filling the top electrode via opening. Photolithography may then be used to pattern the conductive layer. As a result of the filling, the top electrode via may have a bottom surface contacting the first sidewall spacer and a sidewall surface contacting the second sidewall spacer. FIG. 14 illustrates some embodiments of a cross-sectional view 1400 corresponding to act 1522.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the FIGS. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

Thus, as can be appreciated from above, in some embodiments, the present disclosure provides a method of manufacturing an integrated circuit (IC). In the method, a multi-layer stack is formed comprising a bottom electrode layer, a resistance switching dielectric layer over the bottom electrode layer, a top electrode layer over the resistance switching dielectric layer, and a hard mask layer over the top electrode layer. A first series of etch is performed to pattern the hard mask layer, the top electrode layer and the resistance switching dielectric layer to form a hard mask, a top electrode and a resistance switching dielectric. A first dielectric spacer layer is formed over the bottom electrode layer, extending alongside the resistance switching dielectric, the top electrode, and the hard mask, and further extending over the hard mask. A second dielectric spacer layer is formed directly on and conformally lining the first dielectric spacer layer. The first dielectric spacer layer is deposited at a first temperature and the second dielectric spacer layer is deposited at a second temperature higher than that of the first temperature.

In another embodiment, the present disclosure relates to a method of manufacturing an integrated circuit (IC). In the method, a multi-layer stack is formed comprising a bottom electrode layer, a resistance switching dielectric layer over the bottom electrode layer, a top electrode layer over the resistance switching dielectric layer, and a hard mask layer over the top electrode layer. A first series of etch is performed to pattern the hard mask layer, the top electrode layer and the resistance switching dielectric layer to form a hard mask, a top electrode and a resistance switching. A first dielectric spacer layer is formed over the bottom electrode layer, alongside the resistance switching dielectric, the top electrode, and the hard mask. A second dielectric spacer layer is formed directly on and conformally lining the first dielectric spacer layer. A second series of etch is performed to the first dielectric spacer layer and the second dielectric spacer layer to respectively form a first sidewall spacer and a second sidewall spacer. A third series of etch is performed to the bottom electrode layer to form a bottom electrode. A top electrode via is formed reaching on the top electrode.

In yet another embodiment, the present disclosure relates to a memory device. The memory device comprises a bottom electrode disposed over a substrate and a resistance switching dielectric disposed over the bottom electrode and having a variable resistance. The memory device further comprises a top electrode disposed over the resistance switching dielectric and a first sidewall spacer disposed on an upper surface of the bottom electrode and extending upwardly along sidewalls of the resistance switching dielectric and the top electrode. The memory device further comprises a second sidewall spacer directly and conformally lining the first sidewall. The memory device further comprises a top electrode via reaching on the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a memory cell, the method comprising:
forming a multi-layer stack comprising a bottom electrode layer, a resistance switching dielectric layer over the bottom electrode layer, a top electrode layer over the resistance switching dielectric layer, and a hard mask layer over the top electrode layer;
performing a first series of etch to pattern the hard mask layer, the top electrode layer and the resistance switching dielectric layer to form a hard mask, a top electrode and a resistance switching dielectric;
forming a first dielectric spacer layer over the bottom electrode layer, extending alongside the resistance switching dielectric, the top electrode, and the hard mask, and further extending over the hard mask; and
forming a second dielectric spacer layer having a bottom surface over the bottom electrode layer and a sidewall surface contacting the first dielectric spacer layer;
wherein the first dielectric spacer layer is deposited at a first temperature and the second dielectric spacer layer is deposited at a second temperature higher than that of the first temperature.

2. The method of claim 1, further comprising:
performing a second series of etch to the first dielectric spacer layer and the second dielectric spacer layer to respectively form a first sidewall spacer and a second sidewall spacer alongside the resistance switching dielectric, the top electrode, and the hard mask; and
performing a third series of etch to pattern the bottom electrode layer according to the top electrode, the first sidewall spacer, and the second sidewall spacer to form a bottom electrode, wherein the bottom electrode has a sidewall aligned with that of the second sidewall spacer.

3. The method of claim 2, further comprising:
forming an upper dielectric layer surrounding the bottom electrode, the second sidewall spacer and overlying the top electrode; and
forming a top electrode via extending through the upper dielectric layer to reach on the top electrode.

4. The method of claim 1, wherein the second dielectric spacer layer has a second thickness greater than at least two times of a first thickness of the first dielectric spacer layer.

5. The method of claim 1, wherein the second temperature of forming the second dielectric spacer layer is greater than 300 Celsius.

6. The method of claim 1, wherein the first dielectric spacer layer is formed in the same cluster tool as performing the first series of etch while the second dielectric spacer layer is formed in a different cluster tool with performing the first series of etch.

7. The method of claim 1, wherein the first dielectric spacer layer is formed directly on the bottom electrode layer.

8. A method for manufacturing a memory cell, the method comprising:
forming a multi-layer stack comprising a bottom electrode layer, a resistance switching dielectric layer over the bottom electrode layer, a top electrode layer over the resistance switching dielectric layer, and a hard mask layer over the top electrode layer;
performing a first series of etch to pattern the hard mask layer, the top electrode layer and the resistance switching dielectric layer to form a hard mask, a top electrode and a resistance switching dielectric;
forming a first dielectric spacer layer over the bottom electrode layer, alongside the resistance switching dielectric, the top electrode, and the hard mask;
forming a second dielectric spacer layer directly on and conformally lining the first dielectric spacer layer;
performing a second series of etch to the first dielectric spacer layer and the second dielectric spacer layer to respectively form a first sidewall spacer and a second sidewall spacer;
performing a third series of etch to the bottom electrode layer to form a bottom electrode after the performance of the second series of etch; and
forming a top electrode via reaching on the top electrode.

9. The method of claim 8, wherein the first dielectric spacer layer is deposited at a first temperature and the second dielectric spacer layer is deposited at a second temperature higher than that of the first temperature.

10. The method of claim 8, wherein the top electrode via is formed by:
forming an upper dielectric layer surrounding the bottom electrode, the second sidewall spacer and overlying the top electrode; and
performing an etch to the upper dielectric layer to form a via opening for filling of the top electrode via;
wherein the etch has a first etching rate for the first sidewall spacer smaller than a second etching rate for the second sidewall spacer.

11. The method of claim 8, wherein the top electrode via is formed to have a bottom surface contacting the first sidewall spacer and a sidewall surface contacting the second sidewall spacer.

12. The method of claim 8, wherein the second dielectric spacer layer is formed to have a thickness greater than at least two times of the first dielectric spacer layer.

13. The method of claim 8, wherein the first dielectric spacer layer is formed in the same cluster tool as performing the first series of etch while the second dielectric spacer layer is formed in a different cluster tool with performing the first series of etch.

14. A method of forming a memory cell, the method comprising:
forming a bottom electrode over a substrate;
forming a resistance switching dielectric over the bottom electrode, the resistance switching dielectric having a variable resistance;
forming a top electrode over the resistance switching dielectric;
forming a first sidewall spacer on an upper surface of the bottom electrode and extending upwardly along sidewalls of the resistance switching dielectric and the top electrode;
forming a second sidewall spacer directly and conformally lining the first sidewall spacer, wherein the second sidewall spacer has a top surface lower or equal to that of the first sidewall spacer; and
forming a top electrode via reaching on the top electrode.

15. The method of claim 14, wherein the second sidewall spacer is formed with a second thickness greater than at least two times of a first thickness of the first sidewall spacer.

16. The method of claim 14, wherein the first sidewall spacer and the second sidewall spacer are made of silicon nitride.

17. The method of claim 14, wherein the top surface of the second sidewall spacer is higher than that of the first sidewall spacer after forming the top electrode via.

18. The method of claim 14, wherein the top electrode via has a bottom surface contacting the first sidewall spacer and a sidewall surface contacting the second sidewall spacer after forming the top electrode via.

19. The method of claim 14, further comprising:
   forming a top interlayer dielectric layer over the top electrode, the first sidewall spacer, and the second sidewall spacer; and
   forming a top metallization line within the top interlayer dielectric layer and coupled to the top electrode through the top electrode via.

20. The method of claim 14,
   wherein the first sidewall spacer is formed directly contacting the sidewalls of the resistance switching dielectric and the top electrode; and
   wherein the second sidewall spacer is formed on the upper surface of the bottom electrode, and wherein a sidewall of the second sidewall spacer is formed as aligned with a sidewall of the bottom electrode.

* * * * *